United States Patent
Zhang et al.

(10) Patent No.: US 11,355,521 B2
(45) Date of Patent: Jun. 7, 2022

(54) DOUBLE-SIDED DISPLAY PANEL AND DISPLAY DEVICE

(71) Applicant: HUIZHOU CHINA STAR OPTOELECTRONICS TECHNOLOGY CO., LTD., Huizhou (CN)

(72) Inventors: Yanxue Zhang, Huizhou (CN); Gang Yu, Huizhou (CN)

(*) Notice: Subject to any disclaimer, the term of this patent is extended or adjusted under 35 U.S.C. 154(b) by 227 days.

(21) Appl. No.: 16/618,407

(22) PCT Filed: Nov. 7, 2019

(86) PCT No.: PCT/CN2019/116384
§ 371 (c)(1),
(2) Date: Dec. 2, 2019

(87) PCT Pub. No.: WO2021/082041
PCT Pub. Date: May 6, 2021

(65) Prior Publication Data
US 2021/0335825 A1    Oct. 28, 2021

(30) Foreign Application Priority Data
Oct. 28, 2019 (CN) .......................... 201911032782.6

(51) Int. Cl.
*H01L 25/16* (2006.01)
*H01L 27/12* (2006.01)

(52) U.S. Cl.
CPC .......... *H01L 27/124* (2013.01); *H01L 25/167* (2013.01)

(58) Field of Classification Search
CPC .......................... H01L 27/124; H01L 25/167
USPC ..... 257/72; 438/48, 128, 149, 151, 157, 283
See application file for complete search history.

(56) References Cited

U.S. PATENT DOCUMENTS

| | | | |
|---|---|---|---|
| 2014/0049449 A1* | 2/2014 | Park | H01L 27/3267 345/1.3 |
| 2018/0046011 A1 | 2/2018 | Tang | |
| 2019/0122604 A1* | 4/2019 | Xu | G09G 3/3208 |

FOREIGN PATENT DOCUMENTS

| | | |
|---|---|---|
| CN | 105572986 A | 5/2016 |
| CN | 106530991 A | 3/2017 |
| CN | 106647069 A | 5/2017 |
| CN | 106773204 A | 5/2017 |
| CN | 106773386 A | 5/2017 |

* cited by examiner

*Primary Examiner* — Didarul A Mazumder

(57) ABSTRACT

A double-sided display panel and a display device are provided. The double-sided display panel includes a first display module, a second display module, a conductive layer, and a driving module. The conductive layer is electrically connected to at least one of the first thin film transistor substrate of the first display module and the second thin film transistor substrate of the second display module.

14 Claims, 2 Drawing Sheets

DOUBLE-SIDED DISPLAY PANEL AND DISPLAY DEVICE

FIELD OF INVENTION

The present disclosure relates to the field of display technologies, and more particularly to a double-sided display panel and a display device.

BACKGROUND OF INVENTION

At present, electronic products tend to be diversified, and a double-sided display function has become an important feature of a new generation of electronic products. For example, a double-sided display device inside a mobile phone can display a main function window of the mobile phone on one side of the mobile phone and display time on another side of the mobile phone. For example, using a doubled-sided display in public can allow people on both sides of the doubled-sided display to see various contents to be displayed.

In current designs, two separate panels are often used to make the double-sided display, which results in the panels need to be bound twice, and two separate circuit boards are required to drive the panels, which increases cost of a display system and makes a structure thereof more complicated.

SUMMARY OF INVENTION

The present invention provides a double-sided display panel and a display device, which can solve technical problems that a number of bindings and complexity of a circuit board are increased, and a display performance is affected due to a preparation of two display panels in the prior art.

In order to solve the above issues, a technical solution provided by an embodiment of the present invention is as follows.

To achieve the above object, an embodiment of the present invention provides a double-sided display panel. The double-sided display panel includes a first display module, a second display module, a conductive layer, and a driving module. The first display module includes a first thin film transistor substrate. The second display module includes a second thin film transistor substrate. The second display module is disposed opposite to the first display module, and the first thin film transistor substrate and the second thin film transistor substrate are attached to each other. The conductive layer is disposed on a side of the double-sided display panel. The conductive layer is disposed on a side surface of at least one of the first thin film transistor substrate and the second thin film transistor substrate. The conductive layer is connected to the side surface of at least one of the first thin film transistor substrate and the second thin film transistor substrate. The driving module is disposed on a side of the double-sided display panel on which the conductive layer is disposed. The driving module is electrically connected to at least one of the first thin film transistor substrate and the second thin film transistor substrate through the conductive layer.

In an embodiment of the present invention, the first display module includes a first color filter substrate disposed opposite to the first thin film transistor substrate, the second display module includes a second color filter substrate disposed opposite to the second thin film transistor substrate, the first color filter substrate and the second color filter substrate are opposite to each other across the first thin film transistor substrate and the second thin film transistor substrate.

In an embodiment of the present invention, the conductive layer is disposed on side surfaces of the first thin film transistor substrate and the second thin film transistor substrate on a same side, the conductive layer is connected to the side surfaces of the first thin film transistor substrate and the second thin film transistor substrate, and the first thin film transistor substrate is flush with a side of the second thin film transistor substrate on which the conductive layer is disposed.

In an embodiment of the present invention, the conductive layer is disposed on a side surface of the first thin film transistor substrate and connected to the side surface of the first thin film transistor substrate, the first film transistor substrate is connected to the driving module through the conductive layer, and the second thin film transistor substrate is connected to the driving module.

In an embodiment of the present invention, the first thin film transistor substrate is not flush with a side of the second thin film transistor substrate on which the conductive layer is disposed, and a side surface of the first thin film transistor substrate is retracted from a side surface of the second thin film transistor substrate to accommodate a thickness of the conductive layer.

In an embodiment of the present invention, the conduction layer is disposed on a side surface of the second thin film transistor substrate, the conduction layer is connected to the side surface of the second thin film transistor substrate, the second thin film transistor substrate is connected to the driving module through the conductive layer, and the first thin film transistor substrate is connected to the driving module.

In an embodiment of the present invention, the first thin film transistor substrate is not flush with a side of the second thin film transistor substrate on which the conductive layer is disposed, and a side surface of the second thin film transistor substrate is retracted from a side surface of the first thin film transistor substrate to accommodate a thickness of the conductive layer.

In an embodiment of the present invention, the driving module includes a circuit board and a flip chip, a side of the flip chip is connected to the first display module and the second display module, and another side of the flip chip is connected to the circuit board.

In an embodiment of the present invention, material of the conductive layer includes a conductive metal or a conductive paste.

To achieve the above object, an embodiment of the present invention further provides a display device including a double-sided display panel. The double-sided display panel includes a first display module, a second display module, a conductive layer, and a driving module. The first display module includes a first thin film transistor substrate. The second display module includes a second thin film transistor substrate. The second display module is disposed opposite to the first display module, and the first thin film transistor substrate and the second thin film transistor substrate are attached to each other. The conductive layer is disposed on a side of the double-sided display panel. The conductive layer is disposed on a side surface of at least one of the first thin film transistor substrate and the second thin film transistor substrate. The conductive layer is connected to the side surface of at least one of the first thin film transistor substrate and the second thin film transistor substrate. The driving module is disposed on a side of the double-sided display panel on which the conductive layer is disposed. The driving module is electrically connected to at least one of the first thin film transistor substrate and the second thin film transistor substrate through the conductive layer.

In an embodiment of the present invention, the first display module includes a first color filter substrate disposed opposite to the first thin film transistor substrate, the second display module includes a second color filter substrate disposed opposite to the second thin film transistor substrate, the first color filter substrate and the second color filter substrate are opposite to each other across the first thin film transistor substrate and the second thin film transistor substrate.

In an embodiment of the present invention, the conductive layer is disposed on side surfaces of the first thin film transistor substrate and the second thin film transistor substrate on a same side, the conductive layer is connected to the side surfaces of the first thin film transistor substrate and the second thin film transistor substrate, and the first thin film transistor substrate is flush with a side of the second thin film transistor substrate on which the conductive layer is disposed.

In an embodiment of the present invention, the conductive layer is disposed on a side surface of the first thin film transistor substrate and connected to the side surface of the first thin film transistor substrate, the first film transistor substrate is connected to the driving module through the conductive layer, and the second thin film transistor substrate is connected to the driving module.

In an embodiment of the present invention, the first thin film transistor substrate is not flush with a side of the second thin film transistor substrate on which the conductive layer is disposed, and a side surface of the first thin film transistor substrate is retracted from a side surface of the second thin film transistor substrate to accommodate a thickness of the conductive layer.

In an embodiment of the present invention, the conduction layer is disposed on a side surface of the second thin film transistor substrate, the conduction layer is connected to the side surface of the second thin film transistor substrate, the second thin film transistor substrate is connected to the driving module through the conductive layer, and the first thin film transistor substrate is connected to the driving module.

In an embodiment of the present invention, the first thin film transistor substrate is not flush with a side of the second thin film transistor substrate on which the conductive layer is disposed, and a side surface of the second thin film transistor substrate is retracted from a side surface of the first thin film transistor substrate to accommodate a thickness of the conductive layer.

In an embodiment of the present invention, the driving module includes a circuit board and a flip chip, a side of the flip chip is connected to the first display module and the second display module, and another side of the flip chip is connected to the circuit board.

In an embodiment of the present invention, material of the conductive layer includes a conductive metal or a conductive paste.

Beneficial effects of an embodiment of the present disclosure are that, by providing a conductive layer on a side of a double-sided display panel to connect two thin film transistor substrates to a same driving module, such that two display modules share one driving module, which reduces a number of bindings and complexity of a circuit board of the double-sided display panel during a manufacturing process, reduces structural complexity of a display device, makes the display device thinner and lighter, and saves manufacturing costs.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
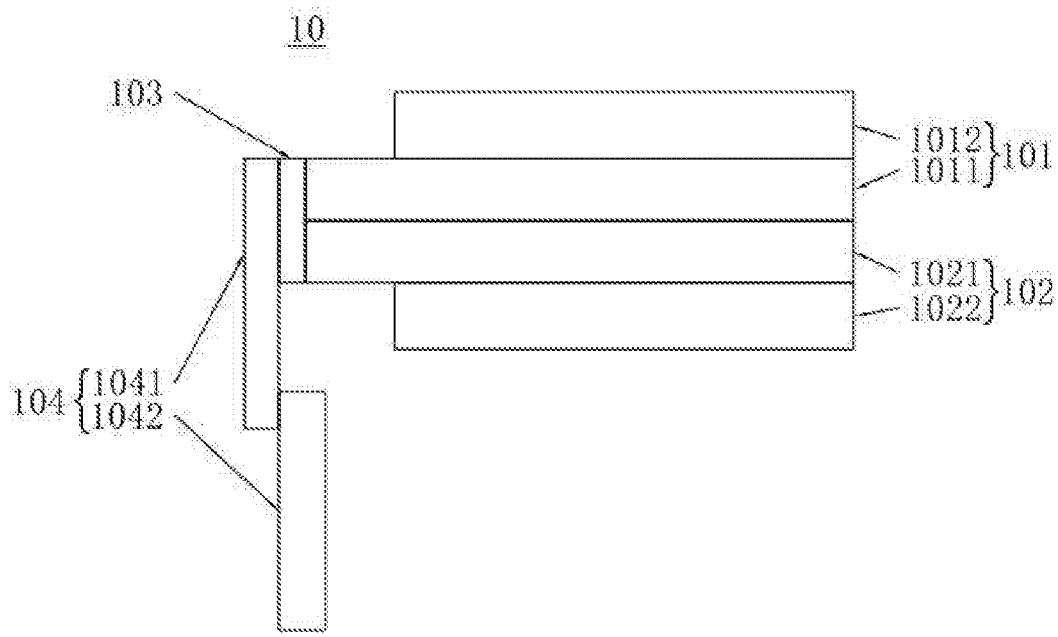
FIG. 1 is a schematic structural diagram of a double-sided display screen according to an embodiment of the present invention.

The following description of the various embodiments is provided to illustrate the specific embodiments by referring to the accompanying drawings. Directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, units with similar structures are labeled with the same reference number.

In current double-sided display panels and display devices, because two panels need to be fabricated, two independent driving modules need to be fabricated to drive the two panels separately, which complicates the structure and increases manufacturing costs. An embodiment of the present invention can solve drawbacks of the prior art.

An embodiment of the present invention provides a double-sided display panel. The double-sided display panel includes a first display module, a second display module, a conductive layer, and a driving module. The first display module includes a first thin film transistor substrate. The second display module includes a second thin film transistor substrate. The second display module is disposed opposite to the first display module, and the first thin film transistor substrate and the second thin film transistor substrate are attached to each other. The conductive layer is disposed on a side of the double-sided display panel. The conductive layer is disposed on a side surface of at least one of the first thin film transistor substrate and the second thin film transistor substrate. The conductive layer is connected to the side surface of at least one of the first thin film transistor substrate and the second thin film transistor substrate. The driving module is disposed on a side of the double-sided display panel on which the conductive layer is disposed. The driving module is electrically connected to at least one of the first thin film transistor substrate and the second thin film transistor substrate through the conductive layer.

Specifically, as shown in FIG. 1, a double-sided display panel 10 includes a first display module 101 and a second display module 102. The first display module 101 includes a first thin film substrate 1011 and the second display module 102 include a second thin film transistor substrate 1021 that is attached to the first thin film transistor substrate 1011.

The double-sided display panel 10 further includes a conductive layer 103. The conductive layer 103 is disposed on a side of the double-sided display panel 10. The conductive layer 103 is disposed on a side surface of at least one of the first thin film transistor substrate 1011 and the second thin film transistor substrates 1021. The conductive layer 103 is connected to the side surface of at least one of the first thin film transistor substrate 1011 and the second thin film transistor substrates 1021. The conductive layer 103 is disposed on side surfaces of the first thin film transistor substrate 1011 and the second thin film transistor substrates 1021 on a same side as only illustrated in FIG. 1. Other examples are described in the following.

In addition, the double-sided display panel 10 further includes a driving module 104. The driving module 104 is disposed on a side of the double-sided display panel 10 on which the conductive layer 103 is disposed. The driving module 104 is electrically connected to at least one of the first thin film transistor substrate 1011 and the second thin film transistor substrate 1021 through the conductive layer 103.

In an implementation process, a current double-sided display panel often uses two separate panels as a local dimming control panel and a display panel, which results in the panels need to be bound twice and requires two independent circuit boards to drive the panels. Therefore, cost of a display system is increased, and a structure thereof becomes more complicated. In an embodiment of the present invention, a conductive layer is disposed on a side of a double-sided display panel, thin film transistor substrates of two display modules are connected to a same driving module, so that two display modules share one driving module, which reduces a number of bindings and complexity of a circuit board of the double-sided display panel during a manufacturing process, reduces structural complexity of a display device, makes the display device thinner and lighter, and saves manufacturing costs.

Specifically, other manufacturing process of the double-sided display panel 10 can be made by referring to a regular process, and the double-sided display panel provided by an embodiment of the present invention will be described in detail below in conjunction with specific embodiments.

Embodiment 1

Referring to FIG. 1, the double-sided display panel 10 includes a first display module 101, a second display module 102, a conductive layer 103, and a driving module 104. The first display module 101 and the second display module 102 are disposed opposite to each other.

The first display module 101 includes a first thin film transistor substrate 1011 and a first color filter substrate 1012, which are disposed opposite to each other. The second display module 102 includes a second thin film transistor substrate 1021 and a second color filter substrate 1022, which are disposed opposite to each other. The first thin film transistor substrate 1011 is attached to the second thin film transistor substrate 1021. The first color filter substrate 1012 and the second color filter substrate 1022 are opposite to each other across the first thin film transistor substrate 1011 and the second thin film transistor substrate 1021.

It can be noted that the first display module 101 and the second display module 102 as described above only show the thin film transistor substrates 1011 and 1021, and the color filter substrates 1012 and 1022, respectively. The structure layers are only a brief description of the partial structure and components of the double-sided display panel 10, but the present invention is not limited thereto. For example, the color filter substrates 1012 and 1022 include black matrixes (BMs), RGB color resist layers, and the like. The transistor substrates 1011 and 1021 include thin film transistor (TFT) devices, scan lines, data lines, pixel electrodes, common electrodes, etc. The double-sided display panel 10 further includes various other display members. For example, an alignment film, a frame glue, and the like are disposed between the first thin film transistor substrate 1011 and the first color filter substrate 1012 and/or between the second thin film transistor substrate 1021 and the second color filter substrate 1022. These details can be implemented by referring to the prior art, and it will not repeat here.

In addition, the conductive layer 103 is disposed on a side of the double-sided display panel 10. In the embodiment, the conductive layer 103 is disposed on side surfaces of the first thin film transistor substrate 1011 and the second thin film transistor substrate 1021 on a same side, and the conductive layer 103 is connected to the side surfaces of the first thin film transistor substrate 1011 and the second thin film transistor substrate 1021 on the same side.

The first thin film transistor substrate 1011 is flush with a side of the second thin film transistor substrate 1021 on which the conductive layer 103 is disposed.

Material of the conductive layer 103 includes a conductive metal or a conductive paste. The conductive metal includes copper, aluminum, or the like.

In this embodiment, the driving module 104 is disposed on a side of the double-sided display panel 10 on which the conductive layer 103 is disposed. The driving module 104 is connected to the first thin film transistor substrate 1011 and the second thin film transistor substrate 1021 through the conduction layer 103.

The driving module 104 includes a flip chip 1041 and a circuit board 1042. A side of the flip chip 1041 is connected to the conductive layer 103, and another side of the flip chip 1041 is connected to the circuit board 1042.

It can be noted that the conductive layer 103 functions to conduct current and transmit signals. The conductive layer 103 connects main control circuits of the first display module 101 and the second display module 102 with driving ICs and other functional circuits in the flip chip 1041 and the circuit board 1042, to achieve transmission of data signals.

Beneficial effects of an embodiment of the present disclosure are that, by providing a conductive layer on a side of a double-sided display panel to connect two thin film transistor substrates to a same driving module, such that two display modules share one driving module, which reduces a number of bindings and complexity of a circuit board of the double-sided display panel during a manufacturing process, reduces structural complexity of a display device, and saves manufacturing costs.

Embodiment 2

Figure 2:
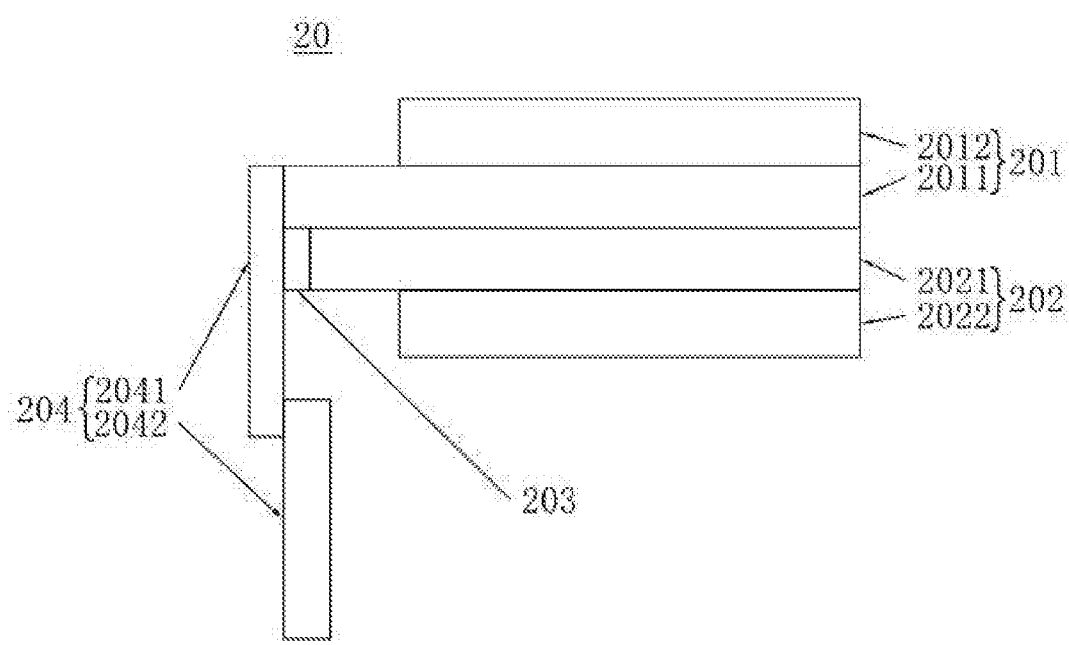
FIG. 2 is a schematic structural diagram of another double-sided display screen according to an embodiment of the present invention.

Referring to FIG. 2, the double-sided display panel 20 includes a first display module 201, a second display module 202, a conductive layer 203, and a driving module 204. The first display module 201 and the second display module 202 are disposed opposite to each other.

The first display module 201 includes a first thin film transistor substrate 2011 and a first color filter substrate 2012, which are disposed opposite to each other. The second display module 202 includes a second thin film transistor substrate 2021 and a second color filter substrate 2022, which are disposed opposite to each other. The first thin film transistor substrate 2011 is attached to the second thin film transistor substrate 2021. The first color filter substrate 2012 and the second color filter substrate 2022 are opposite to each other across the first thin film transistor substrate 2011 and the second thin film transistor substrate 2021.

It can be noted that the first display module 201 and the second display module 202 as described above only show the thin film transistor substrates 2011 and 2021, and the color filter substrates 2012 and 2022, respectively. The structure layers are only a brief description of the partial structure and components of the double-sided display panel 20, but the present invention is not limited thereto. For example, the color filter substrates 2012 and 2022 include black matrixes (BMs), RGB color resist layers, and the like. The transistor substrates 2011 and 2021 include thin film transistor (TFT) devices, scan lines, data lines, pixel electrodes, common electrodes, etc. The double-sided display panel 20 further includes various other display members. For example, an alignment film, a frame glue, and the like are disposed between the first thin film transistor substrate 2011 and the first color filter substrate 1012 and/or between the second thin film transistor substrate 2021 and the second color filter substrate 2022. These details can be implemented by referring to the prior art, and it will not repeat here.

In addition, the conductive layer 203 is disposed on a side of the double-sided display panel 20. In the embodiment, the conductive layer 203 is disposed on a side surface of the second thin film transistor substrate 2021, and the conductive layer 203 is connected to the side surface of the second thin film transistor substrate 2021. The second thin film transistor substrate 2021 is connected to the driving module 204 through the conductive layer 203. The first thin film transistor substrate 2011 is connected to the driving module 204 and is directly connected.

In an embodiment of the present invention, the first thin film transistor substrate 2011 is not flush with a side of the second thin film transistor substrate 2021 on which the conductive layer 203 is disposed, and a side surface of the second thin film transistor substrate 2021 is retracted from a side surface of the first thin film transistor substrate 2011 to accommodate a thickness of the conductive layer 203.

Material of the conductive layer 203 includes a conductive metal or a conductive paste. The conductive metal includes copper, aluminum, or the like.

In this embodiment, the driving module 204 is disposed on a side of the double-sided display panel 20 on which the conductive layer 203 is disposed. The driving module 204 is connected to the second thin film transistor substrate 2021 through the conduction layer 203 and is directly connected to the first thin film transistor substrate 2011.

The driving module 204 includes a flip chip 2041 and a circuit board 2042. A side of the flip chip 2041 is connected to the conductive layer 203, and another side of the flip chip 2041 is connected to the circuit board 2042.

It can be noted that the conductive layer 203 functions to conduct current and transmit signals. The conductive layer 203 connects main control circuits of the second display module 202 with driving ICs and other functional circuits in the flip chip 2041 and the circuit board 2042, the first display module 201 is directly connected to the flip chip 2041 and does not need to pass through the conductive layer 203, to achieve transmission of data signals.

Beneficial effects of an embodiment of the present disclosure are that, by providing a conductive layer on a side of a double-sided display panel to connect two thin film transistor substrates to a same driving module, such that two display modules share one driving module, which reduces a number of bindings and complexity of a circuit board of the double-sided display panel during a manufacturing process, reduces structural complexity of a display device, and saves manufacturing costs.

Embodiment 3

Figure 3:
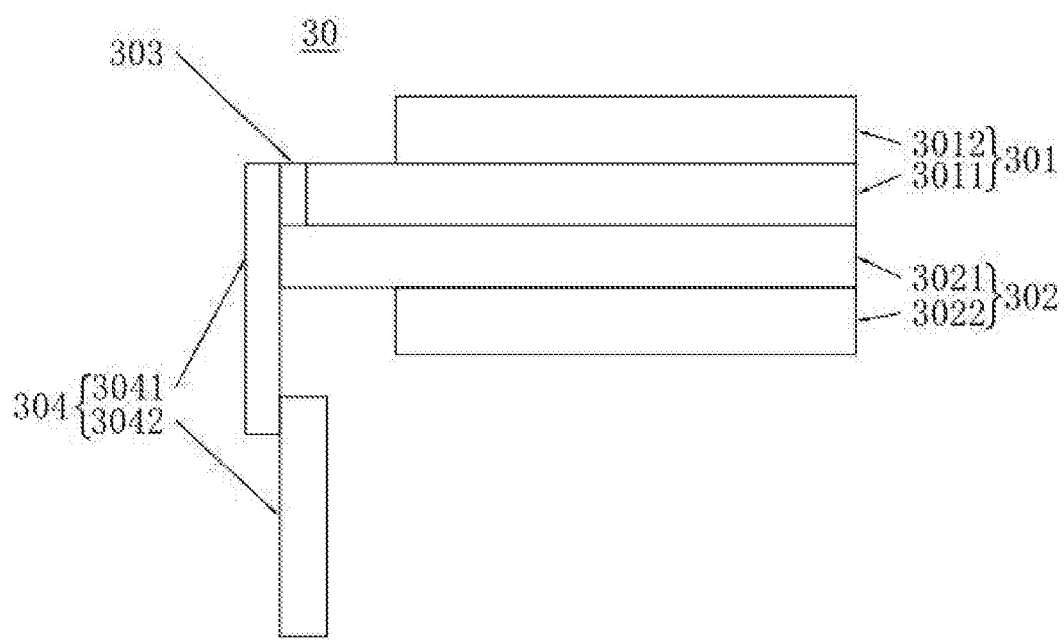
FIG. 3 is a schematic structural diagram of still another double-sided display screen according to an embodiment of the present invention.

Referring to FIG. 3, the double-sided display panel 30 includes a first display module 301, a second display module 302, a conductive layer 303, and a driving module 304. The first display module 301 and the second display module 302 are disposed opposite to each other.

The first display module 301 includes a first thin film transistor substrate 3011 and a first color filter substrate 3012, which are disposed opposite to each other. The second display module 302 includes a second thin film transistor substrate 3021 and a second color filter substrate 3022, which are disposed opposite to each other. The first thin film transistor substrate 3011 is attached to the second thin film transistor substrate 3021. The first color filter substrate 3012 and the second color filter substrate 3022 are opposite to each other across the first thin film transistor substrate 3011 and the second thin film transistor substrate 3021.

It can be noted that the first display module 301 and the second display module 302 as described above only show the thin film transistor substrates 3011 and 3021, and the color filter substrates 3012 and 3022, respectively. The structure layers are only a brief description of the partial structure and components of the double-sided display panel 30, but the present invention is not limited thereto. For example, the color filter substrates 3012 and 3022 include black matrixes (BMs), RGB color resist layers, and the like. The transistor substrates 3011 and 3021 include thin film transistor (TFT) devices, scan lines, data lines, pixel electrodes, common electrodes, etc. The double-sided display panel 30 further includes various other display members. For example, an alignment film, a frame glue, and the like are disposed between the first thin film transistor substrate 3011 and the first color filter substrate 3012 and/or between the second thin film transistor substrate 3021 and the second color filter substrate 3022. These details can be implemented by referring to the prior art, and it will not repeat here.

In addition, the conductive layer 303 is disposed on a side of the double-sided display panel 30. In the embodiment, the conductive layer 303 is disposed on a side surface of the first thin film transistor substrate 3011, and the conductive layer 303 is connected to the side surface of the first thin film transistor substrate 3011. The first thin film transistor substrate 3011 is connected to the driving module 304 through the conductive layer 303. The second thin film transistor substrate 3021 is connected to the driving module 304 and is directly connected.

In an embodiment of the present invention, the first thin film transistor substrate 3011 is not flush with a side of the second thin film transistor substrate 3021 on which the conductive layer 303 is disposed, and a side surface of the first thin film transistor substrate 3011 is retracted from a side surface of the second thin film transistor substrate 3021 to accommodate a thickness of the conductive layer 303.

Material of the conductive layer 303 includes a conductive metal or a conductive paste. The conductive metal includes copper, aluminum, or the like.

In this embodiment, the driving module 304 is disposed on a side of the double-sided display panel 30 on which the conductive layer 303 is disposed. The driving module 304 is connected to the first thin film transistor substrate 3011 through the conduction layer 303 and is directly connected to the second thin film transistor substrate 3021.

The driving module 304 includes a flip chip 3041 and a circuit board 3042. A side of the flip chip 3041 is connected to the conductive layer 303, and another side of the flip chip 3041 is connected to the circuit board 3042.

It can be noted that the conductive layer 303 functions to conduct current and transmit signals. The conductive layer 303 connects main control circuits of the first display module 301 with driving ICs and other functional circuits in the flip chip 3041 and the circuit board 3042, the second display module 302 is directly connected to the flip chip 3041 and does not need to pass through the conductive layer 303, to achieve transmission of data signals.

Beneficial effects of an embodiment of the present disclosure are that, by providing a conductive layer on a side of a double-sided display panel to connect two thin film transistor substrates to a same driving module, such that two display modules share one driving module, which reduces a number of bindings and complexity of a circuit board of the double-sided display panel during a manufacturing process, reduces structural complexity of a display device, and saves manufacturing costs.

In addition, an embodiment of the present invention further provides a display device, and the display device includes a double-sided display panel as described above. The double-sided display panel is provided with a conductive layer on a side surface of the double-sided display panel. Main control circuits of a first display module and a second display module are connected to a same driving module, that is, the two display modules share one driving module. This facilitates simplification of a drive system and cost reduction, and can make an electronic product including the double-sided display panel lighter and thinner.

In the above, the present invention has been disclosed in the above preferred embodiments, but the preferred embodiments are not intended to limit the present invention, and those skilled in the art can make various changes and modifications without departing from the spirit and scope of the present invention. The protection scope of the present invention is defined by the scope of the claims.

What is claimed is:

1. A double-sided display panel, comprising:
a first display module comprising a first thin film transistor substrate;
a second display module comprising a second thin film transistor substrate, wherein the second display module is disposed opposite to the first display module, and the first thin film transistor substrate and the second thin film transistor substrate are attached to each other;
a conductive layer disposed on a side of the double-sided display panel, wherein the conductive layer is disposed on a side surface of at least one of the first thin film transistor substrate and the second thin film transistor substrate, and the conductive layer is connected to the side surface of at least one of the first thin film transistor substrate and the second thin film transistor substrate; and
a driving module disposed on a side of the double-sided display panel on which the conductive layer is disposed, wherein the driving module is electrically connected to at least one of the first thin film transistor substrate and the second thin film transistor substrate through the conductive layer;
wherein the conduction layer is disposed on a side surface of the second thin film transistor substrate, the conduction layer is connected to the side surface of the second thin film transistor substrate, the second thin film transistor substrate is connected to the driving module through the conductive layer, and the first thin film transistor substrate is connected to the driving module;
wherein the first thin film transistor substrate is not flush with a side of the second thin film transistor substrate on which the conductive layer is disposed, and a side surface of the second thin film transistor substrate is retracted from a side surface of the first thin film transistor substrate to accommodate a thickness of the conductive layer.

2. The double-sided display panel according to claim 1, wherein the first display module comprises a first color filter substrate disposed opposite to the first thin film transistor substrate, the second display module comprises a second color filter substrate disposed opposite to the second thin film transistor substrate, the first color filter substrate and the second color filter substrate are opposite to each other across the first thin film transistor substrate and the second thin film transistor substrate.

3. The double-sided display panel according to claim 1, wherein the conductive layer is disposed on side surfaces of the first thin film transistor substrate and the second thin film transistor substrate on a same side, the conductive layer is connected to the side surfaces of the first thin film transistor substrate and the second thin film transistor substrate, and the first thin film transistor substrate is flush with a side of the second thin film transistor substrate on which the conductive layer is disposed.

4. The double-sided display panel according to claim 1, wherein the conductive layer is disposed on a side surface of the first thin film transistor substrate and connected to the side surface of the first thin film transistor substrate, the first film transistor substrate is connected to the driving module through the conductive layer, and the second thin film transistor substrate is connected to the driving module.

5. The double-sided display panel according to claim 4, wherein the first thin film transistor substrate is not flush with a side of the second thin film transistor substrate on which the conductive layer is disposed, and a side surface of the first thin film transistor substrate is retracted from a side surface of the second thin film transistor substrate to accommodate a thickness of the conductive layer.

6. The double-sided display panel according to claim 1, wherein the driving module comprises a circuit board and a flip chip, a side of the flip chip is connected to the first display module and the second display module, and another side of the flip chip is connected to the circuit board.

7. The double-sided display panel according to claim 1, wherein a material of the conductive layer comprises a conductive metal or a conductive paste.

8. A display device comprising a double-sided display, wherein the double-sided display comprises:
a first display module comprising a first thin film transistor substrate;
a second display module comprising a second thin film transistor substrate, wherein the second display module is disposed opposite to the first display module, and the first thin film transistor substrate and the second thin film transistor substrate are attached to each other;
a conductive layer disposed on a side of the double-sided display panel, wherein the conductive layer is disposed on a side surface of at least one of the first thin film transistor substrate and the second thin film transistor substrate, and the conductive layer is connected to the side surface of at least one of the first thin film transistor substrate and the second thin film transistor substrate; and a driving module disposed on a side of the double-sided display panel on which the conductive layer is disposed, wherein the driving module is electrically connected to at least one of the first thin film transistor substrate and the second thin film transistor substrate through the conductive layer;

wherein the conduction layer is disposed on a side surface of the second thin film transistor substrate, the conduction layer is connected to the side surface of the second thin film transistor substrate, the second thin film transistor substrate is connected to the driving module through the conductive layer, and the first thin film transistor substrate is connected to the driving module;

wherein the first thin film transistor substrate is not flush with a side of the second thin film transistor substrate on which the conductive layer is disposed, and a side surface of the second thin film transistor substrate is retracted from a side surface of the first thin film transistor substrate to accommodate a thickness of the conductive layer.

9. The display device according to claim 8, wherein the first display module comprises a first color filter substrate disposed opposite to the first thin film transistor substrate, the second display module comprises a second color filter substrate disposed opposite to the second thin film transistor substrate, the first color filter substrate and the second color filter substrate are opposite to each other across the first thin film transistor substrate and the second thin film transistor substrate.

10. The display device according to claim 8, wherein the conductive layer is disposed on side surfaces of the first thin film transistor substrate and the second thin film transistor substrate on a same side, the conductive layer is connected to the side surfaces of the first thin film transistor substrate and the second thin film transistor substrate, and the first thin film transistor substrate is flush with a side of the second thin film transistor substrate on which the conductive layer is disposed.

11. The display device according to claim 8, wherein the conductive layer is disposed on a side surface of the first thin film transistor substrate and connected to the side surface of the first thin film transistor substrate, the first film transistor substrate is connected to the driving module through the conductive layer, and the second thin film transistor substrate is connected to the driving module.

12. The display device according to claim 11, wherein the first thin film transistor substrate is not flush with a side of the second thin film transistor substrate on which the conductive layer is disposed, and a side surface of the first thin film transistor substrate is retracted from a side surface of the second thin film transistor substrate to accommodate a thickness of the conductive layer.

13. The display device according to claim 8, wherein the driving module comprises a circuit board and a flip chip, a side of the flip chip is connected to the first display module and the second display module, and another side of the flip chip is connected to the circuit board.

14. The display device according to claim 8, wherein a material of the conductive layer comprises a conductive metal or a conductive paste.

\* \* \* \* \*